(12) United States Patent
Benner

(10) Patent No.: US 7,901,267 B1
(45) Date of Patent: Mar. 8, 2011

(54) METHOD FOR CONTROLLING THE FORCES APPLIED TO A VACUUM-ASSISTED PAD CONDITIONING SYSTEM

(75) Inventor: Stephen J. Benner, Lansdale, PA (US)

(73) Assignee: TBW Industries, Inc., Furlong, PA (US)

( * ) Notice: Subject to any disclaimer, the term of this patent is extended or adjusted under 35 U.S.C. 154(b) by 72 days.

(21) Appl. No.: 12/387,837

(22) Filed: May 7, 2009

Related U.S. Application Data

(60) Division of application No. 11/283,595, filed on Nov. 18, 2005, now Pat. No. 7,544,113, which is a continuation-in-part of application No. 10/447,373, filed on May 29, 2003, now Pat. No. 7,052,371.

(51) Int. Cl.
*B24B 1/00* (2006.01)
*B24B 49/00* (2006.01)
*B24B 51/00* (2006.01)

(52) U.S. Cl. ............ 451/5; 451/8; 451/21; 451/56

(58) Field of Classification Search .......... 451/5, 8, 451/11, 21, 56, 72, 443, 444
See application file for complete search history.

(56) References Cited

U.S. PATENT DOCUMENTS

| | | | | |
|---|---|---|---|---|
| 5,456,627 A * | 10/1995 | Jackson et al. | ........... | 451/11 |
| 5,486,131 A * | 1/1996 | Cesna et al. | ........... | 451/56 |
| 5,531,635 A * | 7/1996 | Mogi et al. | ........... | 451/72 |
| 5,885,137 A * | 3/1999 | Ploessl | ........... | 451/56 |
| 5,916,010 A * | 6/1999 | Varian et al. | ........... | 451/38 |
| 6,099,393 A * | 8/2000 | Katagiri et al. | ........... | 451/56 |
| 6,179,693 B1 * | 1/2001 | Beardsley et al. | ........... | 451/56 |
| 6,200,207 B1 * | 3/2001 | Hsu | ........... | 451/443 |
| 6,331,136 B1 * | 12/2001 | Bass et al. | ........... | 451/56 |
| 6,508,697 B1 * | 1/2003 | Benner et al. | ........... | 451/443 |
| 6,645,046 B1 * | 11/2003 | Vogtmann et al. | ........... | 451/8 |
| 7,229,336 B2 * | 6/2007 | Moore | ........... | 451/5 |

* cited by examiner

*Primary Examiner* — Timothy V Eley
*(74) Attorney, Agent, or Firm* — Wendy W. Koba

(57) ABSTRACT

A method and apparatus for conditioning polishing pads that utilizes an apertured conditioning disk for introducing operation-specific slurries, without the need for additional tooling, platens, and materials handling. The method and apparatus utilizes a vacuum capability to pull waste material out of the polishing pad and through the apertured conditioning disk to evacuate the apparatus through an outlet port. The apparatus also includes a force adjustment system for providing measurement and control of the force applied by the conditioning disk to the polishing pad.

3 Claims, 6 Drawing Sheets

METHOD FOR CONTROLLING THE FORCES APPLIED TO A VACUUM-ASSISTED PAD CONDITIONING SYSTEM

CROSS-REFERENCE TO RELATED APPLICATIONS

This application is a divisional of U.S. application Ser. No. 11/283,595, filed Nov. 18, 2005 now U.S. Pat. No. 7,544,113 and issued a Notice of Allowance on Feb. 10, 2009, which is a continuation-in-part of U.S. application Ser. No. 10/447,373, filed May 29, 2003, now U.S. Pat. No. 7,052,371, issued May 30, 2006.

BACKGROUND OF THE INVENTION

1. Field of the Invention

The present invention relates generally to the fields of semiconductor fabrication, microelectromechanical systems (MEMS) fabrication, and precision polishing; and specifically to a method for the removal of waste products from the polishing process, and for the introduction of multiple, different slurries during Chemical Mechanical Polishing (CMP) and planarization.

2. Description of Related Art with Respect to Semiconductor Fabrication

An integrated circuit generally consists of a silicon wafer substrate typically produced or fabricated as a disc with a diameter of 100 to 300 millimeters and a thickness of 16 to 40 mils. Metallic, dielectric and insulator depositions forming interconnected circuits are created on a wafer by a series of processes, such as lithography, vapor deposition, and oxidation, that produce the desired electrical circuitry. An electrical insulating layer, up to one-micron in thickness, is then deposited over the electrical circuit layer. With each layer, a multiplicity of undesired irregularities occur on the surface. These irregularities are on the order of 0.05 to 0.5 microns. It is critically important that these irregularities be planarized, so that new layers of circuitry can be developed without loss of focus in lithography, whereby accurate interconnections can be formed between layers.

Various techniques have been developed and used to effect the removal of these irregularities. Chemical Mechanical Polishing (CMP) (planarity) process has become a key technology to remove irregularities and achieve required planarity, layer and line width geometries of microelectronic devices. A CMP system generally consists of the following components:

1) a polishing pad mounted on a rotating or orbital platen or belt;

2) a stream of polishing slurry (oxidizer and abrasive) whose chemistry and abrasive media is important to polishing performance;

3) large amounts of ultra pure water (UPW) used as a lubricant or flushing medium/agent;

4) slurry components and flushing agents. Additionally, to adjust chemistry or fluid properties during processing;

5) a diamond end effector which controls the surface condition and asperity profile of the polishing pad; and 6) the wafer to be polished mounted in a carrier on a rotating head which supplies the polishing pressure.

The introduction of slurry under the wafer, and the removal of waste products from the polishing and conditioning process, are dependent on the centrifugal force of the rotating pad, the action of the end effector, and the flow of slurry plus UPW.

Irregularities on the wafer are removed with a slurry of oxidating chemicals and very fine abrasive particles continually presented to its surface. Polishing or planarity is generally accomplished with the wafer placed face down on the polishing pad that is rotating beneath the wafer that is itself rotating around a central axis. Linear and orbital methods are also utilized and this invention is applicable to those processes and tools.

Current polishing tools and processes consist of a single operation step per platen because of operation with specific slurries. Additional tools, platens, and materials handling are required to support multi-step polishing operations such as that required for copper CMP.

There currently exists no means of using different chemicals, and abrasives of different materials or particle sizes, without separate equipment or extensive changeover and/or manual cleaning of the polishing equipment.

Polishing pads are generally made of a plastic (urethane) material. The removal rate of wafer irregularities is affected by the pressure applied to the wafer against the polishing pad, the relative speed of the slurry on the wafer, the amount of fresh slurry presented to the surface of the polishing pad, and the circuit pattern of the wafer. The introduction of slurry under the wafer, and the removal of waste products from the polishing process, are dependent on centrifugal force of the rotating pad, the action of the end effector, and the flow of slurry and components and UPW. This type of flushing does not always remove the waste. Large settled abrasive particles from the slurry, and agglomerated slurry and wastes, form in the pores and grooves of the pad, and between diamond particles on the conditioners. Commercial applications have large volumes of UPW used in production and significant amounts of wastewater that must be treated.

The rate of wafer polishing depends upon the pressure applied to the wafer, the slurry, and the diamond head on the end effector arm to roughen or condition the polishing pad, to provide a consistent asperity profile. In cross-section, the pad has regions of peaks and valleys which both carry slurry and provide pressure to the abrasive particles therein. The pad generally consists of a hard or soft urethane material with pores and/or fibers dispersed throughout the active layer. The fibers and/or urethane give the pad rigidity, provide pressure to the abrasive/wafer interface, and aid in the removal of material from the surface of the wafer. The pores act as a reservoir for the slurry facilitating the chemical contact and interaction with the wafer surface. The chemical interaction is an important 'accelerator' over an abrasive-only polishing situation, and therefore is critical to overall process performance and control.

The diamond end effector generally consists of diamond particles embedded in a metal matrix in the form of a rotating disk. The disk is principally used to texture the polishing pad so that a sustainable rate of planarization can occur on the wafer and wafer to wafer. It is also used to remove used slurry and debris from the pad. The used slurry and debris often occurs as large hard agglomerations which consist of silicon dioxide ($SiO_2$), dielectric and metals that become embedded in the polishing pad. These materials reduce removal or polishing rates and repeatability, and can produce defects in the form of scratches that damage the wafer surface and device performance (opens, shorts). Data from the semiconductor industry reveal that 60% of chip loss is due to contamination. The CMP process has been reported to be a major source of this contamination.

The uncontrolled delivery and removal (flushing) of process fluids can also cause polishing waste to build-up on many surfaces within the tooling. When dislodged, these dried/agglomerated compounds can lead to additional defects. Slurry has proven to be "unstable", prone to agglomeration due to shear forces in delivery systems, heat, and age effects. There is also potential for diamond particles to fracture or be torn from the metal matrix of the end effector disk and scratch the wafer surface. Within typical polishing times, from 60 to 600 seconds, there is significant causal mechanisms for scratching and more control of the process is required.

Presently this debris is removed from the pad with copious flushing of the pad with UPW and/or slurry. This method relies on centrifugal force, or other pad movement dynamics, on the liquid to carry off the waste and agglomerates. This is a very uncontrolled method of removal because the flushing cannot break-up the static layer of slurry on the pad surface, nor is it able to dislodge the slurry in the holes of the pad. This could lead to additional agglomerates of slurry becoming deposited in holes and recesses of the pad. This slurry can become dislodged, at a later time, and damage subsequent wafers. The reliance of these "rotational forces" to present new slurry to the wafer/pad interface is also less controlled or repeatable than required, causing variation in removal rates and uniformity.

Polishing pad surfaces, which typically contain pores, holes or grooves for channeling the slurry between the wafer and the pad, require conditioning to create a consistent polishing interface. Slurry and debris from the wafer must be removed by continually "abrading" or "conditioning" the pad surface. Additionally, oxidizing slurries sometimes used in this process contribute to the contamination of the pad by interacting with device layer metals forming harder oxide compounds; or layer delaminations, causing potential contamination and scratching of the wafer.

One apparatus that attempts to solve the problems defined above is described in U.S. Pat. No. 6,508,697, incorporated herein by reference, in which a system for conditioning rotatable polishing pads used to planarize and polish surfaces of thin integrated circuits deposited on semiconductor wafer substrates, microelectronic and optical systems, is disclosed. The system is comprised of a pad conditioning apparatus, process fluids, and a vacuum capability to pull waste material out of the conditioning pad, self-contained flushing means, and a means for imparting a vibratory motion to the pad conditioning abrasive or fluids. The pad conditioning apparatus is comprised of an outer chamber in a generally circular configuration with an inlet port for introducing process fluids and/or UPW and an outlet port for supplying negative pressure.

Considering the prior art conditioning apparatus described above, it is an objective of the present invention to provide a method and system for conditioning polishing pads with a self-contained cleansing means for removing debris and loose slurry, as it is dislodged during the conditioning process. Accordingly, it is an additional objective of the present invention to provide a conditioning system in which the conditioning force (pressure) applied by the end effector can be precisely controlled while maintaining parallel orientation between the end effector and the polishing pad. A further objective is to provide a capability to measure the applied (resultant) forces (downforce and vacuum pressure) and adjust these forces, as appropriate.

It is also an objective to provide means for the introduction of different (multi-step) operations with specific slurries or additives without additional tools, platens, and materials handling.

Another objective is to allow for neutralization of slurry chemistry between steps.

A further objective is to allow for the introduction of alternative/additional slurry or chemical feeds.

Yet another objective is to allow for multi-step polishing on each platen.

A still further objective is to increase through-put by allowing a more aggressive first polishing step, and subsequent, finer abrasive/chemical selectivity near the planarization endpoint.

Another objective is to eliminate intermediate material handling and to allow for single platen processing of copper and barrier metal films.

Yet another objective is to extend utility/life of single and double head polishing tools.

Yet another objective is to reduce defectivity through more selective endpoint control via slurry change (chemistry or abrasive).

Yet another objective is to improve uniformity by reducing handling/alignment/fixture variations seen by wafer.

BRIEF SUMMARY OF THE INVENTION

The pad conditioning system used in the present invention, as set forth in U.S. Pat. No. 6,508,697 referred to above, utilizes abrasive disks that have an open structure to collect debris or swarf as it is being abraded off of the substrate surface. The system has a pad conditioning apparatus, process fluids, a vacuum capability to pull waste material out of the conditioning pad, self-contained flushing means, and a piezoelectric device for vibrating the pad conditioning abrasive. The debris, as it is being created, is pulled through the holes of the abrasive and magnetic support, into a chamber behind the support, and into a conduit to a disposal system. Jets of water, other cleaning, or neutralizing chemicals are sprayed through the abrasive in conjunction with the waste removal. This flushing/abrading/vacuum cleaning thoroughly cleans the polishing pad surface, enabling alternative materials to be introduced without cross contamination. All of these elements combine in operation to provide a unique and effective system for conditioning and cleaning polishing pads. They also allow for the introduction into the conditioning, cleaning and polishing processes operation-specific slurries or other chemicals, without the need for extensive retooling, platen change-out, and/or additional material handling.

The pad conditioning apparatus has an outer chamber in a generally circular configuration with an inlet port for introducing process fluids and/or UPW, and an outlet port for attaching negative pressure. The outer chamber houses a rotating impeller assembly with impeller blades radiating outward from the impeller shaft. The shaft of the impeller assembly protrudes through an opening in the top surface of the outer chamber and is attached to the equipment's end effector assembly. A support disk, a magnetic disk or mechanical fastening means, and an abrasive conditioning disk, are attached to the impeller in a stacked configuration. As described in U.S. Pat. No. 4,222,204, incorporated herein by reference, the abrasive disk is held in place magnetically or mechanically, offering full support of the disk, because it pulls the disk flat to the support disk. The assembly is constructed with aligned holes that allow debris on the polishing pad to be vacuumed up through these holes.

In operation, the outer chamber is held stationary with an attached hose connected to a vacuum facility. The water or slurry is introduced either from an inlet port on the outer chamber, or from the center of the impeller through a water collar. It has been found that the addition of a vacuum capability at the point of conditioning yields an effective increase in the conditioning pressure of the end effector against the polishing pad. Accordingly, while the conditioning pressure may be changing over time due to mechanical wear of internal components, the conditioning pressure may also be effectively greater than expected due to the presence of the vacuum force. This situation results in further uncertainty in the actual conditioning pressure. In addition, the range of forces that may be applied to the polishing pad may be limited by the amount of pressure that can be exerted on the end effector and/or the components thereof. Such an undesirable limitation of these forces may lead to undesirably slow and inefficient conditioning. Additionally, vertical movement of the end effector may alone not be able to compensate for the excessive pressure applied due to the presence of a vacuum. Accordingly, a "floating" outer chamber has been developed that has some degree of freedom to allow for the face of the chamber to uniformly contact the polishing pad surface. Therefore, when a vacuum is applied to the arrangement, a vacuum seal is created by means of intimate contact between the outer chamber and the pad surface. While the outer chamber remains sealed, the pressure applied by the end effector to the polishing pad may still be varied, with the possibility of lifting the abrasive conditioning disk from the pad surface (i.e., a "zero" downforce). The "floating" outer chamber arrangement may be provided by, for example, a set of biasing springs and associated screws or by magnetic elements of like polarity disposed in opposition to each other within the chamber and the end effector. In the latter case, the magnetic elements perform the additional function of maintaining constant alignment between the components (that is, the outer chamber is prevented from rotating with respect to the end effector).

A series of pressurized water holes radiating out from the center of the impeller disk allows full coverage of the abrasive disk and aids in the break up of the static layers in the pores of the polishing pad. The vacuum action pulls the water and debris immediately up through the aligned holes in the support, magnetic, and abrasive disks, and the rotating impeller blades sweep the water and debris into the vacuum pickup outlet and into the disposal system. The aligned holes, or "open structure", in the stacked disks allows collection of debris or swarf, as it is being dislodged from the surface of the pad, allowing continuous conditioning and cleaning without interference of the debris between the abrasive disk and the surface of the wafer. The magnetic fastening structure allows for rapid changeover and provides controlled flatness for the abrasive. A mechanical method can also be used which would be gimbaled for alignment and cushioning. One exemplary mechanical method of providing this gimbaling comprises a ball and socket design that functions to level the abrasive disk within the conditioning holder. Barbed fittings may be used with the ball and socket arrangement to provide a means for coupling a pressurized medium into the conditioning holder. The use of a gimbaled arrangement allows for the independent control of the various force elements (e.g., downforce, vacuum) involved in the conditioning process (which may further include the force of an incoming stream of conditioning fluids onto the pad surface at a pressure of, for example, 100 psi). The independent control of the movement/applied force of the conditioning holder/apertured disk with respect to the outer chamber allows for the arrangement to respond to sheer (normal) force, without the use of a relatively high conformal force. Therefore, as stated above, the elimination of any dependence between the two forces allows for a "zero" downforce to be imparted (that is, a lifting of the conditioning holder) while allowing the outer chamber (and associated vacuum) to remain in contact with the pad surface. Vacuum pulls the wastes from the process, and lifts the polishing pad asperities into an uncompressed position. Select holes also introduce process fluids, such as cleaning chemicals, slurry, passivating agents, complexing agents, surfactants, and UPW, and even cleaning gasses, to the pad in a much more controlled (pressure, location, sequence, and pad/wafer surface conditions, for instance) fashion.

A self-contained flushing system provides water to loosen and flush the debris up the disks holes into the impeller chamber and on through to the disposal system. A sealed bearing at the top of the outer chamber prevents water or process fluids from escaping. This flushing method also reduces the amount of UPW that is presently needed to flush the polishing pad. This saves on costly slurry, the volume of UPW, and the expensive waste disposal.

The impeller provides firm backing for the magnetic disk or mechanical fastening and abrasive disk. The magnet is secured to the support disk mechanically or by an adhesive. The abrasive disk is either magnetically or mechanically secured to the support disk. This system allows for periodic cleaning of the pad conditioning apparatus, as well as periodic replacement of the magnet and abrasive disks, without the need to disassemble the entire outer chamber and inner impeller assembly, which would incur extensive down time.

A piezoelectric transducer is provided near the free end of the end effector arm or fluid stream. When excited with a high frequency voltage, transducer imparts a low amplitude vibration to the pad conditioning apparatus, further enhancing the breakup and removal of the static layer of slurry on the polishing pad surface. A small vertical force imparted by the end effector arm on the polishing pad also aids in breaking up glazing of the slurry, and aids in dislodging particles wedged in the polishing pad surface.

BRIEF DESCRIPTION OF THE DRAWINGS

FIG. 1 is a perspective view of the major elements of the Chemical Mechanical Polishing (CMP) system used in the present invention with the wafer holder removed.

FIG. 2 is a top schematic view of the constituent components used in the present invention.

FIG. 3 is a view of the outer chamber taken along line 6-6 of FIG. 2.

FIG. 4 is a section view of the conditioning apparatus used in the present invention taken along line 7-7 of FIG. 2.

FIG. 5 is an exploded view of the constituent components of the conditioning apparatus used in the present invention showing the outer chamber and impeller assembly.

DETAILED DESCRIPTION OF THE PRESENT INVENTION

The present invention relates to a method of conditioning polishing pads used in Chemical Mechanical Polishing or Planarizing (CMP) Systems for removing irregularities on semiconductor wafer substrates. The specific details of the preferred embodiment provide a thorough understanding of the invention; however, some CMP system elements which operate in conjunction with the present invention have not been elaborated on because they are well known and may tend to obscure other aspects that are unique to this invention. It will be obvious to one skilled in the art that the present invention may be practiced without these other system elements.

Figure 1:
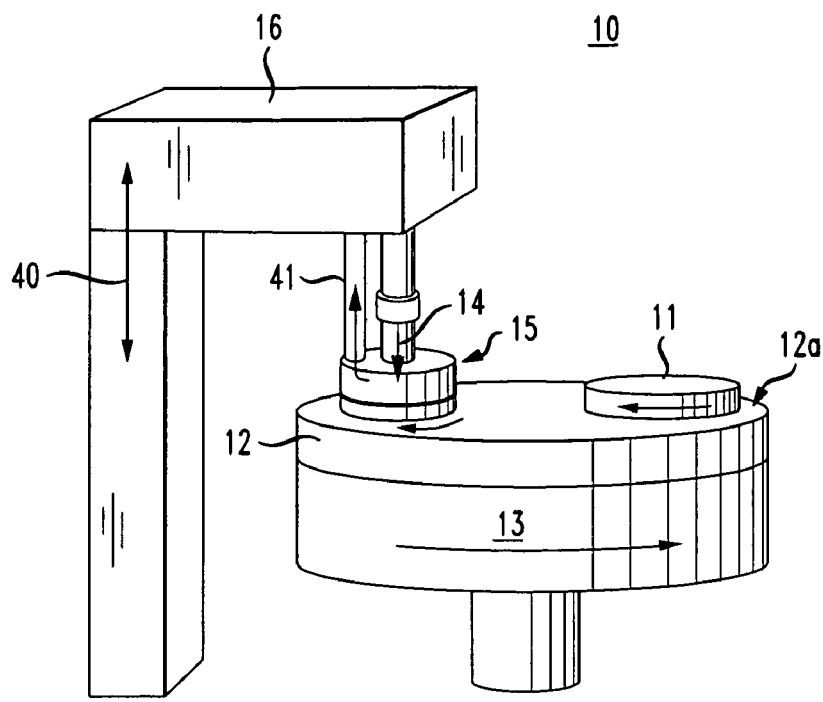
FIGS. 1 through 5 illustrate the prior art system of U.S. Pat. No. 6,508,697.
Figure 2:
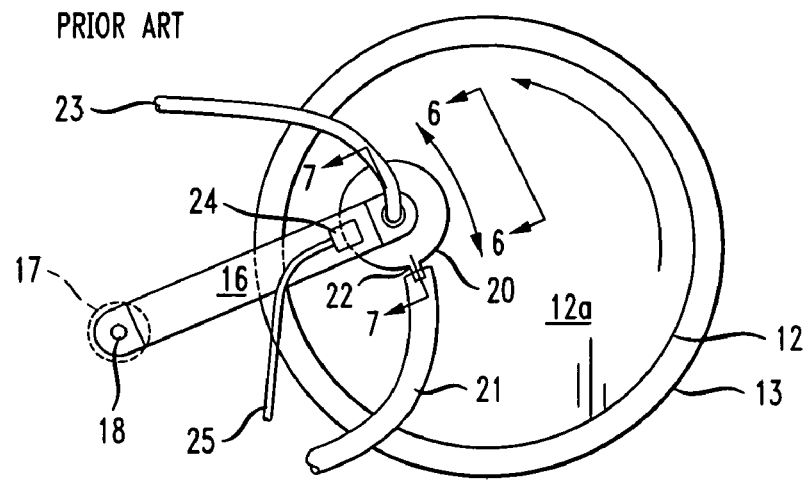
Figure 7:
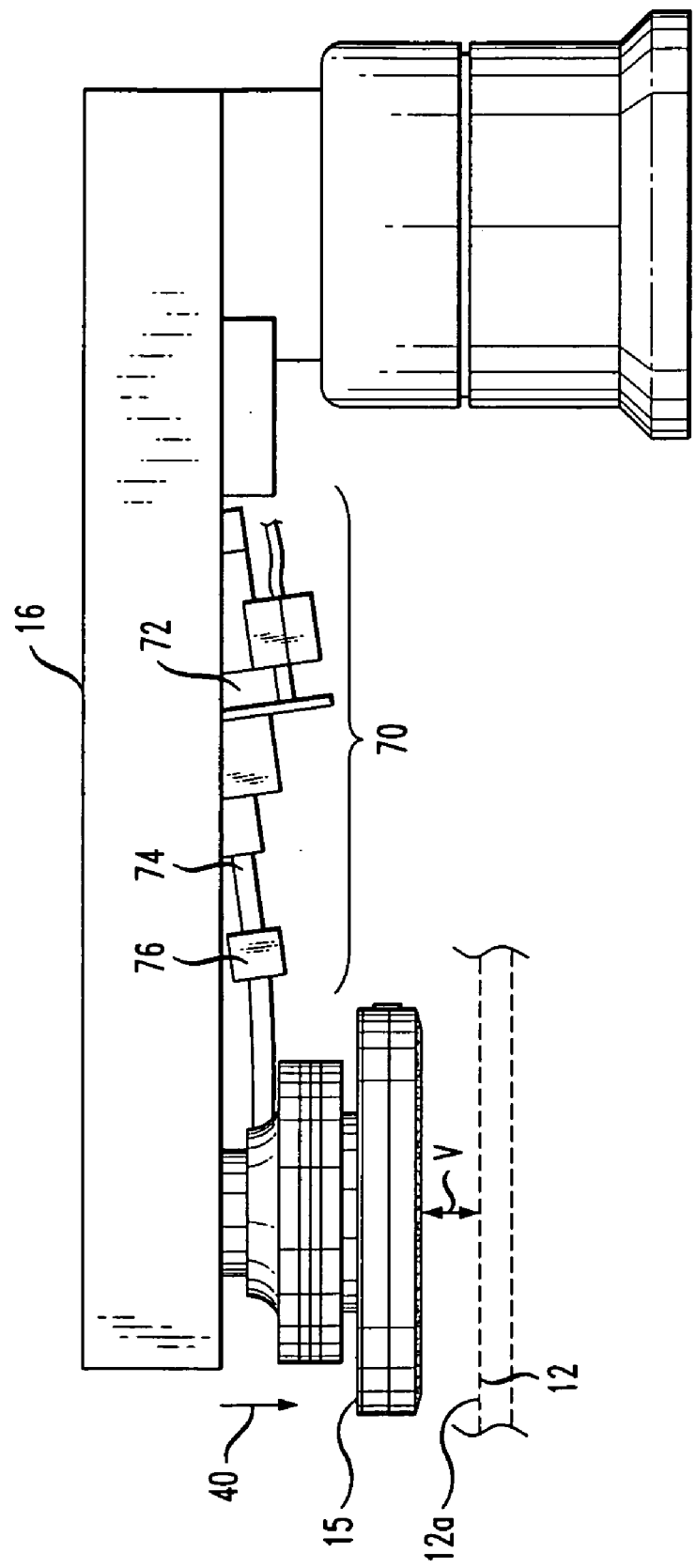
FIG. 7 illustrates an adjustment system for inclusion with the pad conditioning apparatus of the present invention.

Referring to FIG. 1, a perspective view of a typical CMP system 10 is illustrated generally comprising a polishing head (not shown) that applies pressure to wafer 11 against a polishing pad 12 through a wafer carrier and support arm (not shown), and a polishing pad conditioning apparatus 15. Wafer 11 is rotated on polishing pad 12 that is secured to rotating, orbital or linear platen 13. (The wafer carrier, support arm and motor are not shown). A stream of polishing slurry 14 generally containing an oxidizer, abrasive and/or ultra-pure water (UPW) is poured on the polishing pad surface 12a and in cooperation with the rotating motion of wafer 11 acts to remove a few tenths of microns of surface unevenness on wafer 11 after each layer of integrated circuit fabrication. Pad conditioning apparatus 15 operates to restore and maintain polishing pad surface 12a as it is changed by the polishing action. Motor 17, as seen in FIG. 2, pivots end effector arm 16 in an arc about fixed shaft 18 while simultaneously providing rotational motion and a downward force 40 to pad conditioning apparatus 15. Debris from the polishing operation is removed through outlet 41. An adjustment system 70 may also be included within pad conditioning apparatus 15, where adjustment system 70 is attached to end effector arm 16 as shown, for example, in FIG. 7. In accordance with the present invention, adjustment system 70 is utilized to provide the desired control of end effector arm 16 in the presence of various force considerations, including downward force 40 and a vacuum force engaged to remove debris from the pad surface. In particular, adjustment system 70 comprises an actuator 72 that is coupled to end effector arm 16. Actuator 72 may comprise a double-acting cylinder driven by pressure differential in the cylinder chambers. The double-acting feature enables both sides of a piston flange (not shown) to be alternately pressurized and thereafter translated into bi-directional powered motion of a drive element 74 that extends from linear actuator 72. Drive element 74, in turn, effectuates the application of the vertical force to conditioning holder 20 with respect to polishing pad 12. Alternatively, one side of the piston flange may be pressurized to provide force and motion to drive element 74 with a spring providing return force after pressure is released. The positioning of actuator 72 on the underside of end effector arm as shown in the embodiment of FIG. 7 allows for conditioning apparatus 15 to maintain a relatively low profile as may be required when such a system is limited by the tight tolerances associated with various OEM CMP arrangements. In other embodiments, actuator 72 may be disposed at any location along effector arm 16, as well as its base 90, that provides the desired motion of conditioning holder 20 through a suitable connecting arrangement. As shown in FIG. 7, adjustment system 70 may further include a pressure transducer 76 that is used, as described below in association with FIG. 8, to control the level of vacuum applied to pad conditioning apparatus 15.

Figure 5:
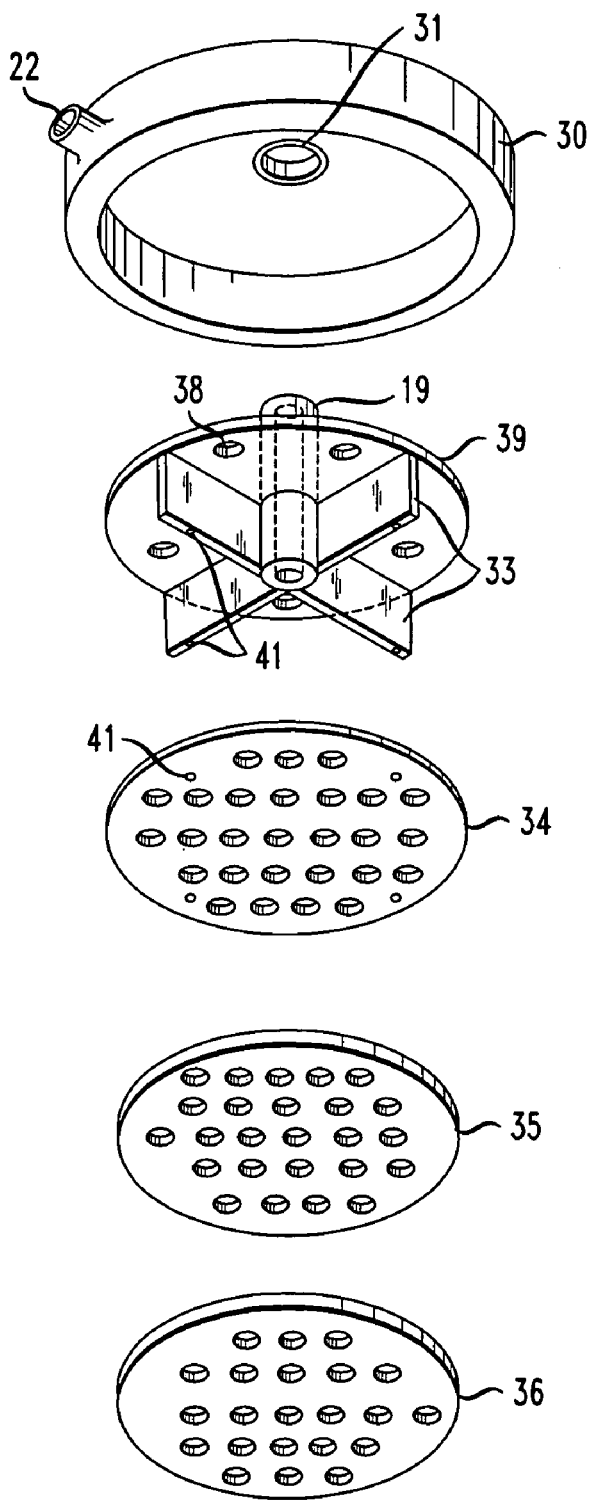

A pad conditioning apparatus 15 used in the present invention is shown in the top view of FIG. 5 and is configured to mechanically and electrically interface with end effector arm 16. Pad conditioning apparatus 15 is designed to automatically dispense chemicals, slurry and/or UPW, so as to condition polishing pad surface 12a and vacuum out debris formed by the polishing process, without interfering with the polishing process or incurring excessive down time. Hose 21, which is attached to vacuum outlet port 22, on the periphery of conditioning holder 20, pulls debris into a vacuum facility (not shown). Hose 23, which is attached to inlet port 19 projects through the top center of conditioning holder 20, and provides a stream of abrasive slurry for consistent coverage of the pad surface 12a, and/or provides neutralizers, UPW, or cleaning agents, for flushing and lubrication. To enhance debris removal, piezo-electric device 24 when excited with a high frequency voltage through electrical connection 25, imparts a low amplitude vibratory impulse to conditioning apparatus 15, thereby agitating debris particles on conditioning pad surface 12a, causing the debris particles to become dislodged for easier removal.

Figure 3:
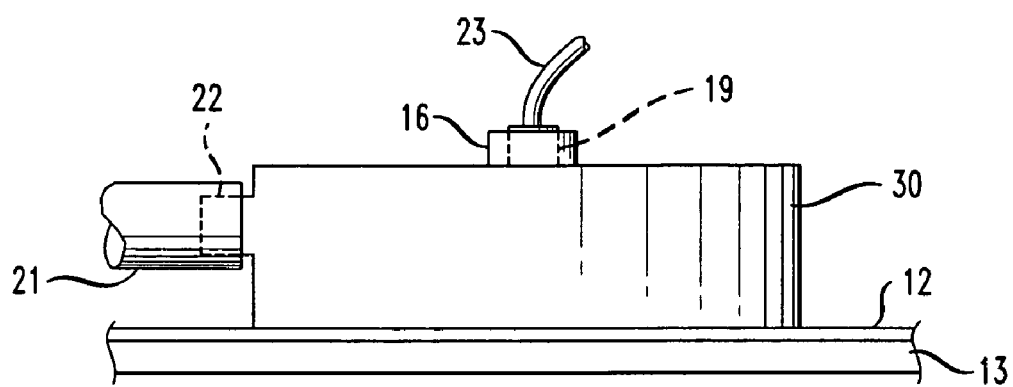

Outer chamber 30 of conditioning holder 20 shown in FIG. 3 is a view taken along line 6-6 of FIG. 2. Outer chamber 30 of the current embodiment, is approximately four inches in diameter and three inches high. It will be obvious to one skilled in the art that the present invention may be practiced with dimensional characteristics other than those described, up to and inclusive of the entire working surface of the pad.

Figure 4:
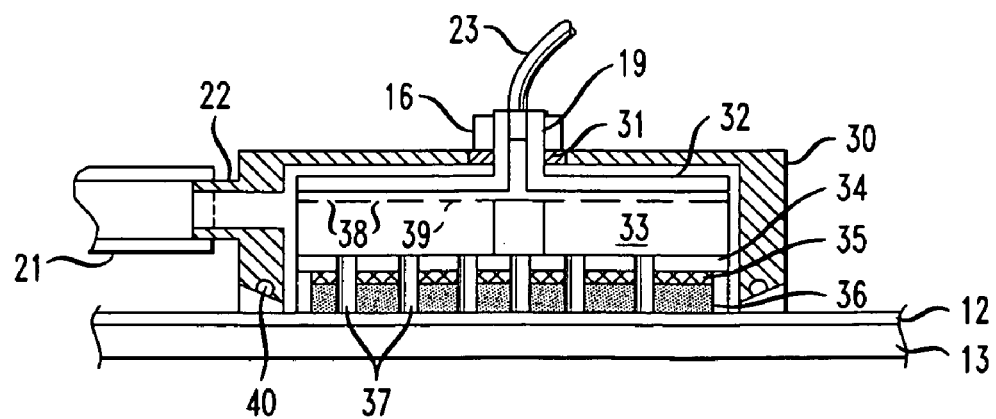

FIG. 4 is a sectional view taken along line 7-7 of FIG. 2, and shows the impeller assembly 32 with support disk 34, magnetic disk 35, and abrasive disk 36, attached to impeller blades 33. Holes 37 in each of the disks are aligned, such that debris is pulled from polishing disk 12 to vacuum outlet 22. Process fluid is taken in through hose 23 and evenly distributed through outlets 38 in impeller disk 39, to polishing pad 12, through holes 37. Seal 31 between outer chamber 30 and impeller shaft 19 prevents process fluid from escaping. An annular channel 40, in outer chamber 30, can provide a secondary means of introducing process and flushing fluids to polishing pad 12.

FIG. 5 is an exploded view that more clearly shows the constituent parts of conditioning apparatus 15 with screw attachment holes 41 securing support disk 34 to impeller blades 33. Although only four impeller blades 33 are shown in this view, other impeller blade configurations, including non-rotating "BAR"/chamber configurations, will provide the same function as that described in this embodiment.

Figure 6:
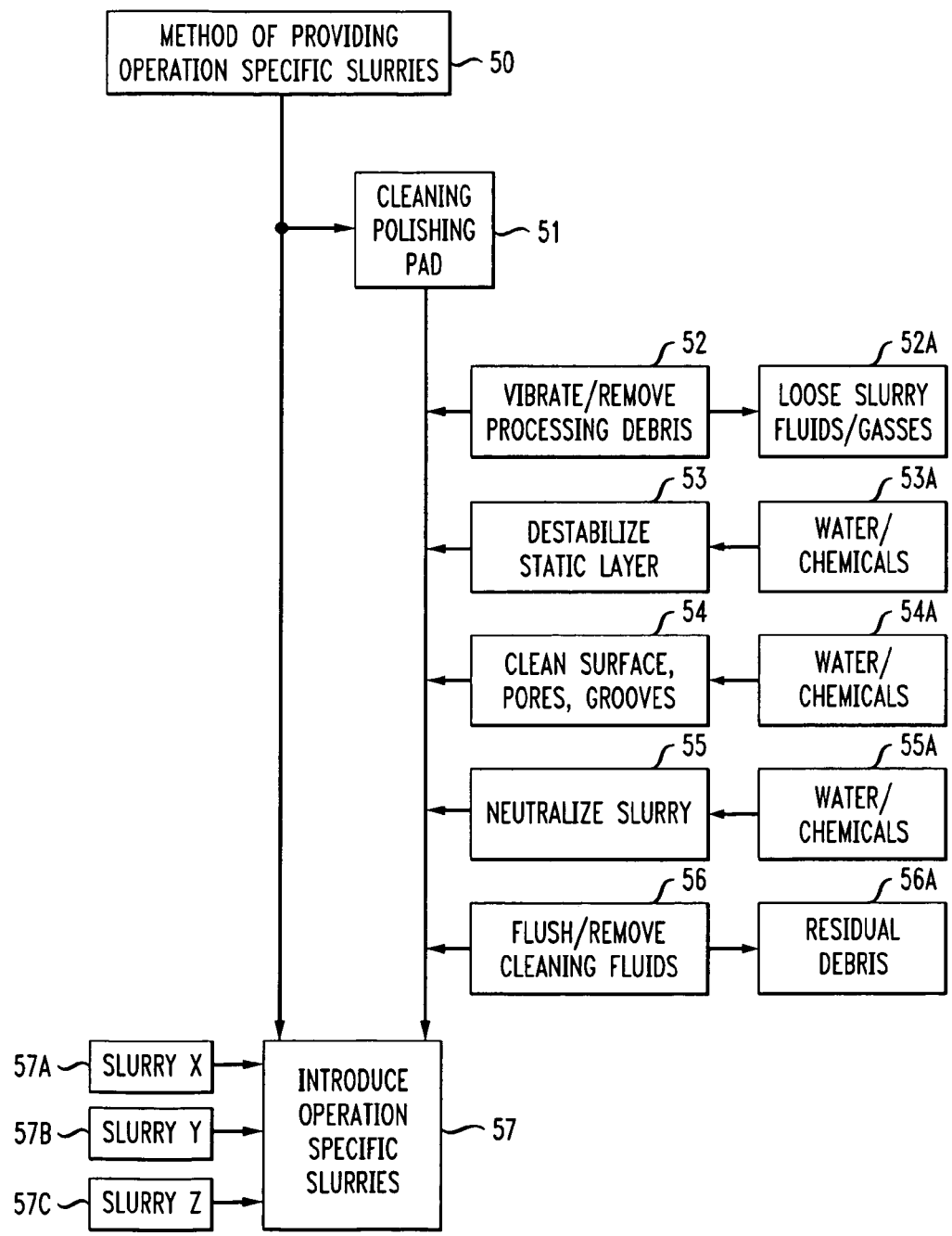
FIG. 6 is a block diagram showing the method of the present invention.

The method of providing operation specific slurries 50 of the present invention is shown in the block diagram of FIG. 6. Cleaning the polishing pad 51 in process is comprised of at least five operations run in parallel, sequentially or any combination. This operation can be run in-situ or ex-situ, and can support dynamic in-process pH adjustments to control removal rate and/or endpoint selectivity. The polishing pad 12 is subjected to a vibratory motion 52 to remove processing debris of loose slurry, fluids, and gasses 52A. The static layer that may remain is destabilized 53 with vacuum, water and other chemicals 53A. The polishing pad surface, pores, and grooves 54 are then cleaned with vacuum, water and chemicals 54A. A further step involves neutralizing the slurry 55 residue on the pad surface with water and other chemicals 55A. The final step is flushing 56 to remove cleansing fluids and any remaining debris 56A. With the conditioning apparatus thoroughly cleaned, other operation specific slurries 57A, 57B, and 57C may be introduced to the process via slurry feed system or at 57 to the conditioning apparatus 10.

Figure 8:
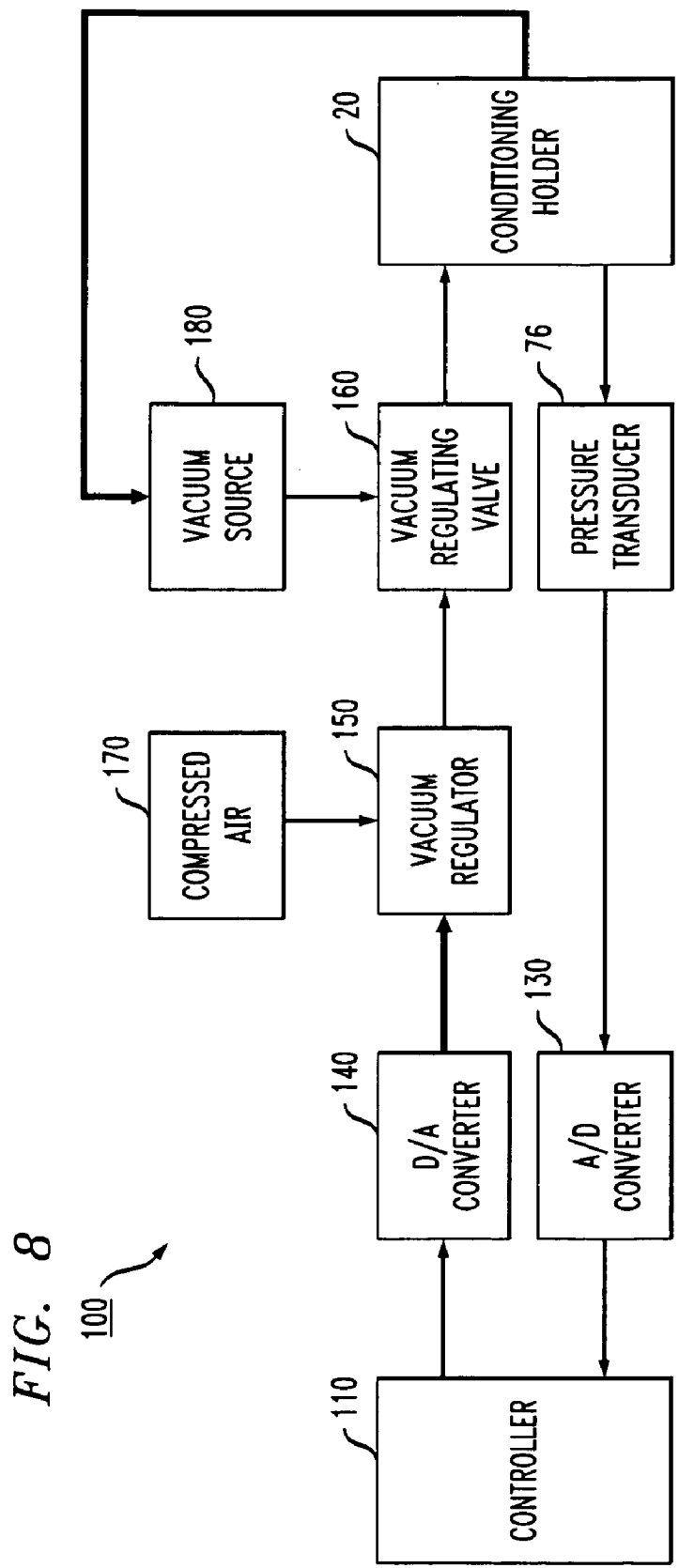
FIG. 8 illustrates the inventive arrangement for measuring and controlling the level of vacuum applied to the conditioning holder of the present invention.

FIG. 8 contains a simplified schematic of a preferred system 100 for measuring and controlling the level of vacuum applied to conditioning holder 20. In this system, a process controller 110 monitors the vacuum level in conditioning holder 20 via pressure transducer 7, where as discussed above, pressure transducer 76 may be formed as part of adjustment system 70. Pressure transducer 76 sends a signal to an analog/digital converter 130, which translates the measured analog signal to a digital representation for use by controller 110. Process controller 110 thereafter adjusts the level of its output command signal so as to provide the appropriate change in vacuum based on a desired set point (the set point being stored within a member element of controller 110). The digital output from controller 110 is then converted to an analog control signal by a D/A converter 140 and used as a control signal input to a vacuum regulator 150 (for example, an electro-pneumatic regulator) that functions to generate a vacuum control signal proportional to the input voltage signal. The output signal from regulator 150 is thereafter applied as an input to a vacuum regulating valve 160, which outputs a vacuum level proportional to the input control signal so as to modify the vacuum pressure within conditioning holder 20. In the case where vacuum regulator 150 comprises an electro-pneumatic device, the vacuum control signal is in the form of a pressure signal, supplied from a compressed air source 170, and provided as a pneumatic input signal to vacuum regulating valve 160. In accordance with the present invention, vacuum regulating valve 160 is specifically designed to tolerate the type of media that flows from conditioning process debris.

It is to be understood that these various examples of force control in a CMP conditioning system are exemplary only. Any number of process variations may be made by virtue of modifying the components of, for example, the force adjustment system and/or the vacuum control system. All of these variations are considered to be within the realm of one skilled in the art and, therefore, the subject matter of the present invention is intended to be limited only by the scope of the claims appended hereto.

What is claimed is:

1. A method of adjusting the force applied through a conditioning apparatus end effector arm to a polishing pad surface in a CMP system, the method comprising the steps of:
  a) measuring a force applied through the conditioning apparatus end effector arm using a force transducer, the force transducer generating an analog voltage representation of the applied force;
  b) providing the measured force as an input to a force controller processor;
  c) comparing the measured force to a set point value maintained within the force control processor;
  d) determining the difference between the measured force and the set point;
  e) generating a force correction signal based upon the determined difference; and
  f) applying the correction signal as an input to a vacuum source coupled to the conditioning apparatus.

2. The method as defined in claim 1 wherein in performing step a), the measured force is converted to a digital signal representation as the input to the force controller processor in step b).

3. The method as defined in claim 2 wherein in performing step f), the following steps are performed:
  f1) applying the correction signal as an input to a vacuum regulator;
  f2) translating the correction signal into an output vacuum adjustment signal; and
  f3) applying the vacuum adjustment signal as an input to a vacuum regulating valve for adjusting a vacuum pressure within the conditioning apparatus.

* * * * *